United States Patent
Krafft et al.

(10) Patent No.: US 7,239,332 B1
(45) Date of Patent: Jul. 3, 2007

(54) DEVICE FOR AND METHOD OF VIEWING MAGNETIC PATTERN RECORDED ON MAGNETIC MEDIA

(75) Inventors: Charles S. Krafft, Owings, MD (US); John B. Dottellis, Damascus, MD (US)

(73) Assignee: The U.S. Government as represented by the National Security Agency, Washington, DC (US)

( * ) Notice: Subject to any disclaimer, the term of this patent is extended or adjusted under 35 U.S.C. 154(b) by 359 days.

(21) Appl. No.: 11/017,538

(22) Filed: Dec. 17, 2004

(51) Int. Cl.
*G01R 33/00* (2006.01)
*G01R 33/12* (2006.01)
*G11B 9/00* (2006.01)

(52) U.S. Cl. ................. 346/74.2; 324/261; 324/213
(58) Field of Classification Search ............ 324/213, 324/260–261; 346/74.2–74.7
See application file for complete search history.

(56) References Cited

U.S. PATENT DOCUMENTS

| 4,032,980 A | 6/1977 | Haas et al. |
| 4,101,905 A | 7/1978 | Hale et al. |
| 5,034,754 A | 7/1991 | Taylor et al. |
| 5,543,911 A | 8/1996 | Jeffers |
| 5,565,772 A | 10/1996 | Jeffers |

*Primary Examiner*—Bot LeDynh
(74) *Attorney, Agent, or Firm*—Robert D. Morelli

(57) ABSTRACT

The present invention is a device for and method of viewing a magnetic pattern recorded on magnetic media. The device includes a base. The base has an opening and includes registration marks for aligning the magnetic media as desired. The base is attachable to a viewer. A guide is connected to the base so that it slides within the opening in the base. The guide also has an opening. An inflatable bladder is attached to, and under, the guide. The inflatable bladder fills the opening in the guide. A holder is attached to the base so that it can slide along the base and be closed onto the guide. The holder also includes an opening. A magnetic garnet film is set within the opening in the holder. A magnetic media is placed on the guide. The holder is closed onto the magnetic media and the guide. The inflatable bladder is inflated so that the magnetic media is brought into physical contact with the magnetic garnet film. The pattern on the magnetic media is transferred onto the magnetic garnet film. The viewer is used to view the magnetic pattern transferred to the magnetic garnet film.

15 Claims, 4 Drawing Sheets

DEVICE FOR AND METHOD OF VIEWING MAGNETIC PATTERN RECORDED ON MAGNETIC MEDIA

FIELD OF THE INVENTION

The present invention pertains to recorders and, more particularly, to magnetographic recorders.

BACKGROUND OF THE INVENTION

Examination of magnetic media is enhanced by the viewing of magnetization patterns.

U.S. Pat. No. 4,032,980, entitled "RECORDED MAGNETIC MEMBER VIEWING APPARATUS," discloses a device for viewing magnetic images on magnetizable recording members. The device includes ferrofluid and metal flakes between transparent substrates. The present invention neither includes a ferrofluid nor metal flakes. U.S. Pat. No. 4,032,980 is hereby incorporated by reference into the specification of the present invention.

U.S. Pat. No. 4,101,905, entitled "METHOD FOR WRITING AND VIEWING MAGNETIC HUMAN READABLE CHARACTERS AND VIEWING MEANS THEREFOR," discloses a device for and method of magnetically recording information in human readable form and viewing the same using encapsulated ferromagnetic particles. The present invention neither magnetically records information in human readable form nor uses encapsulated ferromagnetic particles to read the same. U.S. Pat. No. 4,101,905 is hereby incorporated by reference into the specification of the present invention.

U.S. Pat. No. 5,034,754, entitled "MAGNETIC PATTERN VIEWER," discloses a device for visually displaying magnetic patterns using magnetic particles suspended in liquid. The present invention does not view magnetic patterns using magnetic particles suspended in a liquid. U.S. Pat. No. 5,034,754 is hereby incorporated by reference into the specification of the present invention.

U.S. Pat. No. 5,543,911, entitled "METHOD OF CURRENCY OR DOCUMENT VALIDATION BY USE OF AN ANTI-COUNTERFEITING MAGNETIC VIEWING STRIP," discloses a method of authenticating currency or documents by adding magnetic material in the form of encapsulated nickel flakes suspended in fluid to the currency or document, moving a magnet in the vicinity of the added material, and noting whether or not light patterns reflected from the added material change in response to the movement of the magnet. The present invention does not use nickel flakes suspended in fluid. U.S. Pat. No. 5,543,911 is hereby incorporated by reference into the specification of the present invention.

U.S. Pat. No. 5,565,772, entitled "HIGH SENSITIVITY MAGNETIC VIEWER USING ANHYSTERETIC TRANSFER FOR VIEWING WEAR MAGNETIC PATTERNS," discloses a device for viewing weak magnetic fields of around 1 Oe by applying an alternating current (AC) magnetic field of more than 100 Oe, which is then slowly reduced to zero, to bismuth-garnet on a transparent substrate while a small direct current (DC) bias field is applied. The present invention neither uses an AC magnetic field nor a DC bias field to view magnetic patterns. U.S. Pat. No. 5,565,772 is hereby incorporated by reference into the specification of the present invention.

SUMMARY OF THE INVENTION

It is an object of the present invention to view a magnetic pattern recorded on magnetic media.

It is another object of the present invention to view different areas of a magnetic pattern recorded on magnetic media.

It is another object of the present invention to view different areas of a magnetic pattern recorded on magnetic media and to spatially relate one view with another.

It is another object of the present invention to view a magnetic garnet film used to view a magnetic pattern on a magnetic media before and after the magnetic pattern is transposed onto the magnetic garnet film.

The present invention is a device for and method of viewing a magnetic pattern recorded on magnetic media.

The device of the present invention includes a base. The base has an opening and includes registration marks for aligning the magnetic media as desired. The base is attachable to a viewer.

A guide is connected to the base so that it slides within the opening in the base. The guide also has an opening.

An inflatable bladder is attached to, and under, the guide. The inflatable bladder fills the opening in the guide.

A holder is attached to the base so that it can slide along the base and be closed onto the guide. The holder also includes an opening.

A magnetic garnet film is set within the opening in the holder.

The method of the present invention includes the following steps.

The first step of the method is placing the magnetic media on the guide.

The second step of the method is using the at least one alignment mark on the base to align the magnetic media as desired.

The third step of the method is closing the holder onto the magnetic media.

The fourth step of the method is inflating the inflatable bladder so that the magnetic media comes into physical contact with the magnetic garnet film in the holder. By doing so, the magnetic pattern on the magnetic media is transferred to the magnetic garnet film.

The fifth step of the method is viewing the magnetic pattern on the magnetic garnet film with a viewer.

DETAILED DESCRIPTION

The present invention is a device for and method of viewing a magnetic pattern recorded on magnetic media. The magnetic media may be any magnetic media such as audio tape, video tape, and computer tape.

Figure 1:
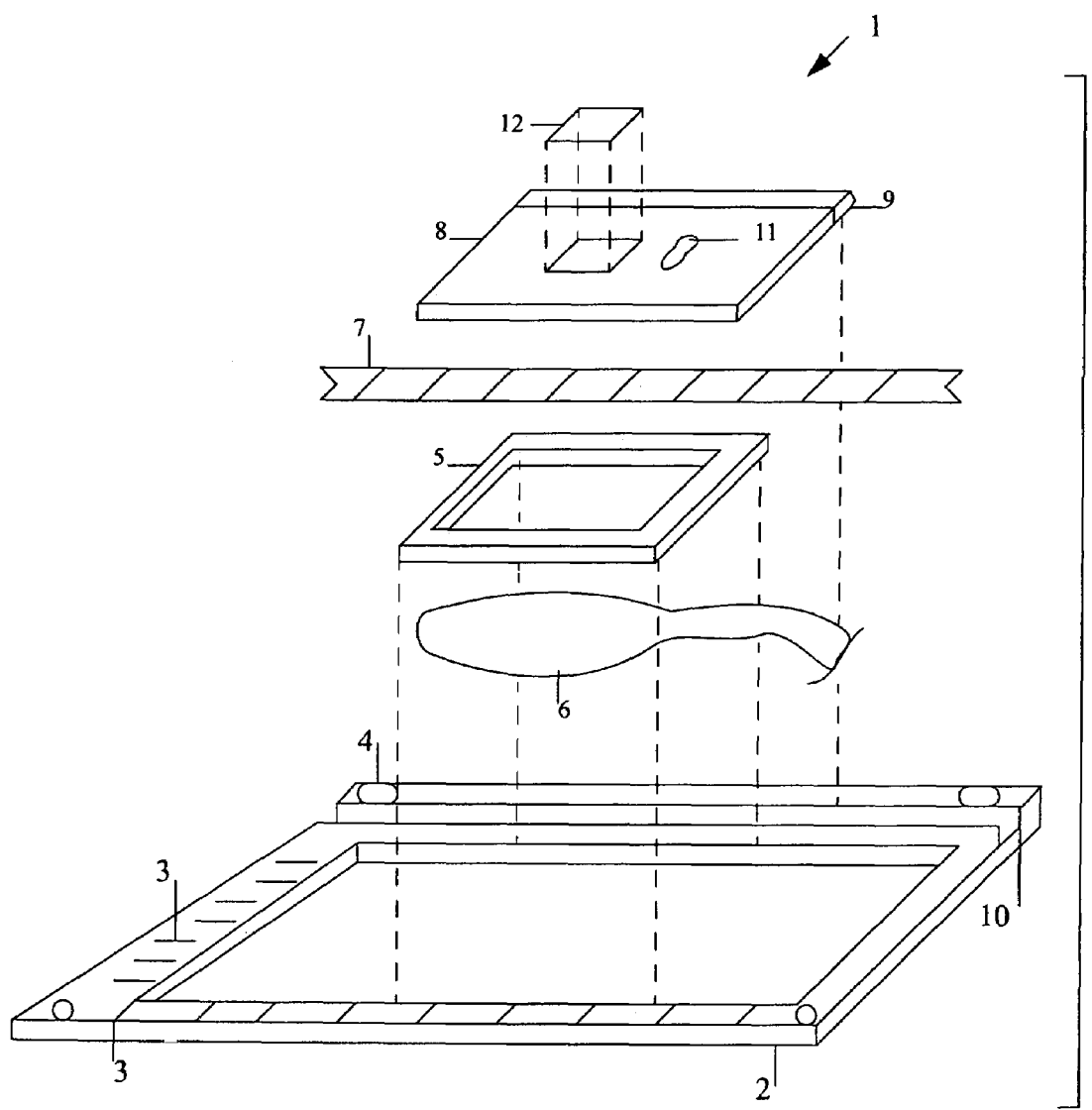
FIG. 1 is an exploded view of the device of the present invention.

FIG. 1 is an exploded view of the device 1 of the present invention.

The device 1 includes a base 2. The base 2 includes an opening. The base 2 includes at least one registration mark 3 in at least one axis on the base 2 for aligning the magnetic media as desired. In the preferred embodiment, the at least one registration mark 3 is a ruler. The base 2 is attachable to a viewer (not shown). In the preferred embodiment, the illuminating viewer is a microscope, preferably a microscope with a linearly polarized light source and a rotatable linear polarizer in the reflected light path. In a second alternate embodiment, the illuminating viewer includes a device for integrating registration information into the image produced by the illuminating viewer. In the preferred embodiment, the base 2 includes at least one bolt-hole 4 so that the base may be attached to the viewer using at least one bolt (not shown). However, any other suitable attachment mechanism may be used with the device 1. In an alternate embodiment, at least one spring clip is used to hold the magnetic media.

A guide 5 is connected to the base 2 so that the guide 5 can slide along the full length of the opening in the base 2. The guide 5 also includes an opening.

An inflatable bladder 6 is attached to the guide 5. The inflatable bladder 6 is attached under the guide 5 and fills the opening in the guide 5. In the preferred embodiment, the inflatable bladder 6 includes a pump-up ball (not shown) for inflating the inflatable bladder 6 and a release valve (not shown) for making the inflatable bladder 6 airtight during inflation and for releasing air during deflation. In an alternate embodiment, the inflatable bladder 6 includes a pressure gauge (not shown).

In FIG. 1, magnetic media 7 is shown where it would be during operation of the device 1, between the guide 5 and a holder 8.

The holder 8 is attached to the base 2 so that the holder 8 may slide along the entire length of the base 2 in the direction of the opening in the base 2. The holder 8 is attached to the base 2 by a hinge 9 in the holder 8. The hinge 9 may be attached within a groove 10 within the base 2 or to a bar (not shown) attached to the base 2. When closed, the holder 8 is brought down onto the magnetic media 7, the guide 5, and the portion of the inflatable bladder 6 that is within the opening in the guide 5. The hinge 9 may be a spring-open or spring-close type hinge. If the hinge 9 is a spring-open type hinge then an alternate embodiment of the present invention includes a clamp (not shown) which is brought into contact with the base 2 and the holder 8 for holding down the holder 8 when necessary. In an alternate embodiment, the clamp is attached to the base 2 so that it slides in the direction of the opening in the base 2. The holder 8 includes an opening. In the preferred embodiment, the opening in the holder 8 is smaller than, and alignable within, the opening in the guide 5. In an alternate embodiment, the holder 8 includes at least one slot 11 outside of the area covered by the inflatable bladder 6 for checking the alignment of the magnetic media.

A magnetic garnet film 12 is set within the opening in the holder 8. In an alternate embodiment, the magnetic garnet film 12 may be slideably attached to the holder 8.

Figure 2:
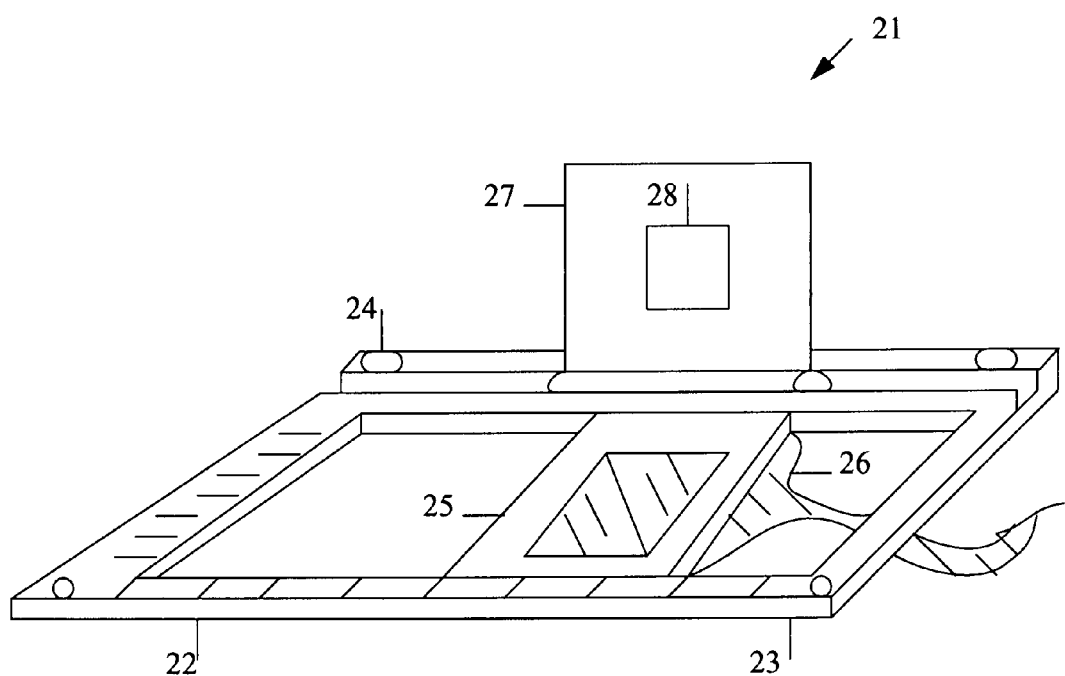
FIG. 2 is a perspective view of the device of the present invention.

FIG. 2 is a perspective view of device 21 of the present invention. It shows the base 22, the alignment marks 23, one of a number of possible means for attaching the base 22 to a viewer (e.g., bolt-hole 24), the guide 25, the inflatable bladder 26, the holder 27, and the magnetic garnet film 28.

Figure 3:
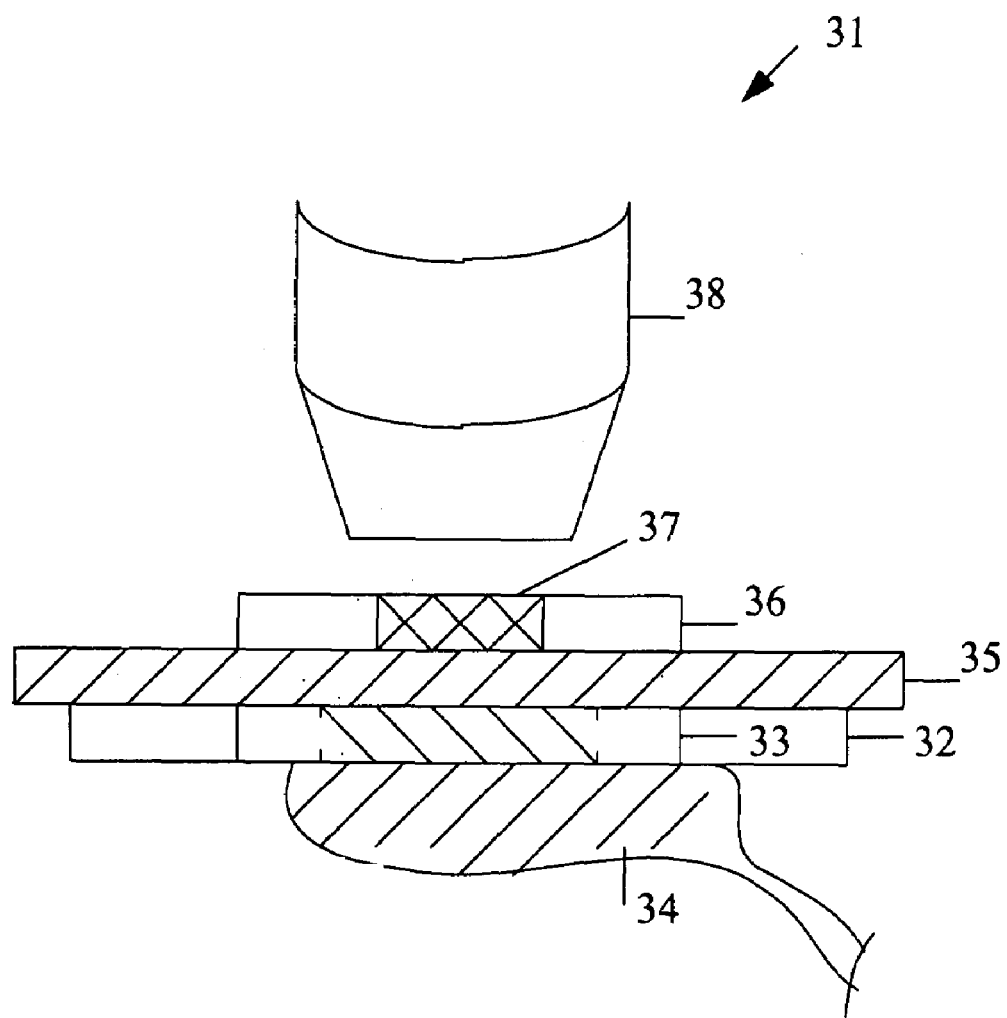
FIG. 3 is a side view of the device of the present invention.

FIG. 3 is a side-view of the device 31 of the present invention as seen when in operational use (i.e., viewing magnetic media). It shows the base 32, the guide 33, the inflatable bladder 34, the magnetic media 35, the holder 36, the magnetic garnet film 37, and a viewer 38.

Figure 4:
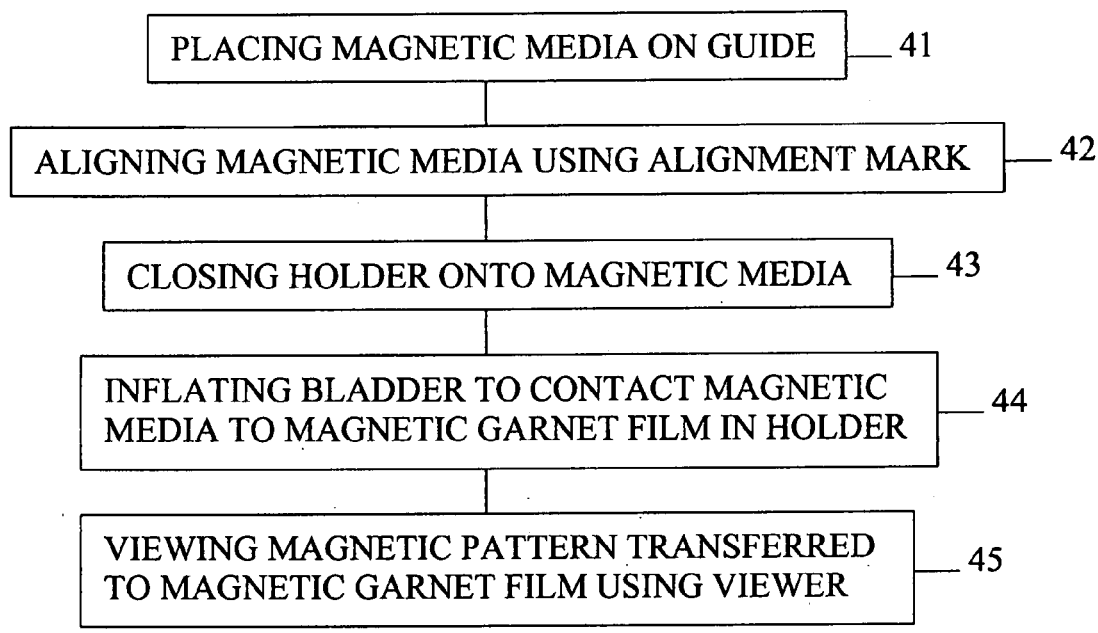
FIG. 4 is a list of the steps of the method of the present invention.

FIG. 4 is a list of the steps of the present method for viewing a magnetic pattern recorded on magnetic media.

The first step 41 of the method is placing the magnetic media on a guide.

The second step 42 of the method is using the at least one alignment mark on a base to align the magnetic media as desired.

The third step 43 of the method is closing a holder onto the magnetic media.

The fourth step 44 of the method is inflating an inflatable bladder so that the magnetic media comes into physical contact with a magnetic garnet film in the holder. By doing so, the magnetic pattern on the magnetic media will be transferred to the magnetic garnet film.

The fifth, and final, step 45 of the method is viewing the magnetic pattern on the magnetic garnet film with a viewer. In the preferred embodiment, a microscope is used to view the magnetic pattern on the magnetic garnet film, preferably a polarizing-light microscope.

What is claimed is:

1. A device for viewing a magnetic pattern recorded on magnetic media, comprising:
    (a) a base, where the base includes a first opening, where the base includes at least one registration mark in at least one axis on the base, and where the base is attachable to a viewer;
    (b) a guide slideably connected to the base, where the guide is within the first opening of the base, and where the guide includes a second opening;
    (c) an inflatable bladder attached to the guide, where the inflatable bladder is under the guide and fills the second opening in the guide;
    (d) a holder, where the holder is hingeably and slideably attached to the base, where the holder includes a third opening; and
    (e) a magnetic garnet film set within the third opening in the holder.

2. The device of claim 1, wherein the at least one registration mark on the base is at least one ruler.

3. The device of claim 1, wherein the base includes at least one bolt hole.

4. The device of claim 1, wherein the viewer to which the base is attachable is a microscope.

5. The device of claim 4, wherein the microscope includes a linearly polarized incident light source and a rotatable linear polarizer.

6. The device of claim 1, wherein the inflatable bladder includes a pressure gauge.

7. The device of claim 1, wherein the third opening in the holder is smaller than, and alignable within, the second opening in the guide.

8. The device of claim 1, where the holder is hingeably attached to the base in a hingeable attachment selected from the group of hingeable attachments consisting of spring-shut attachment and spring-open attachment.

9. The device of claim 1, where the holder is slideably attached to the base in a slideable attachment selected from the group of slideable attachments consisting of a groove in the base and a bar attached to the base.

10. The device of claim 1, further including a clamp slideably connected to the base.

11. The device of claim 1, wherein the holder includes at least one slot.

12. The device of claim 1, further including at least one spring clip.

13. The device of claim 1, wherein the magnetic garnet film is slideably attached to the holder.

14. Method of viewing a magnetic pattern recorded on magnetic media, comprising the steps of:
    (a) placing the magnetic media on a guide;
    (b) using at least one alignment mark on a base to align the magnetic media as desired;

(c) closing a holder onto the magnetic media;
(d) inflating an inflatable bladder so that the magnetic media comes into physical contact with a magnetic garnet film in the holder; and
(e) viewing the magnetic pattern which has been transferred onto the magnetic garnet film as a result of step (d) with a viewer.

15. The method of claim 14, wherein the step of viewing the magnetic pattern which has been transferred onto the magnetic garnet film as a result of step (d) with a viewer is comprised of the step of viewing the magnetic pattern transferred onto the magnetic garnet film as a result of step (d) with a microscope.

* * * * *